(12) United States Patent
Mayer (10) Patent No.: US 8,497,216 B2
(45) Date of Patent: Jul. 30, 2013

(54) MICROMECHANICAL COMPONENT

(75) Inventor: Thomas Mayer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 25 days.

(21) Appl. No.: 13/112,351

(22) Filed: May 20, 2011

(65) Prior Publication Data

US 2011/0298063 A1    Dec. 8, 2011

(30) Foreign Application Priority Data

Jun. 4, 2010 (DE) .......................... 10 2010 029 709

(51) Int. Cl.
*H01L 29/84* (2006.01)

(52) U.S. Cl.
USPC ............. 438/758; 438/51; 438/50; 438/52; 438/53; 257/415; 257/682; 257/704; 257/E21.5; 257/E29.234

(58) Field of Classification Search
USPC . 257/415, 682, 704, E29.324, E21.5; 438/51, 438/50, 52, 53, 758
See application file for complete search history.

(56) References Cited

U.S. PATENT DOCUMENTS

2009/0079037 A1 *   3/2009   Weber et al. .................. 257/618

* cited by examiner

*Primary Examiner* — Thinh T Nguyen
(74) *Attorney, Agent, or Firm* — Kenyon & Kenyon LLP (57) ABSTRACT

A method is described for manufacturing a micromechanical component. The method includes providing a first substrate, forming a first connecting structure on the first substrate, and forming a microstructure on the first substrate after forming the first connecting structure. The microstructure has at least one movable functional element. The method further includes providing a second substrate having a second connecting structure, and joining the first and second substrates by carrying out a bonding process, the first and second connecting structures being joined to form a common connecting structure, and a sealed cavity being formed in the region of the microstructure. The method provides that the first connecting structure takes the form of a buried connecting structure extending up to an upper surface of the first substrate. Also described is a related micromechanical component.

9 Claims, 5 Drawing Sheets

MICROMECHANICAL COMPONENT

RELATED APPLICATION INFORMATION

The present application claims priority to and the benefit of German patent application no. 10 2010 029 709.7, which was filed in Germany on Jun. 4, 2010, the disclosure of which is incorporated herein by reference.

FIELD OF THE INVENTION

The present invention relates to a micromechanical component and a method for manufacturing a micromechanical component, a first and a second substrate being joined to one another by carrying out a bonding process.

BACKGROUND INFORMATION

Micromechanical components, which are used, for example, in the automotive field as inertial or pressure sensors, normally have a microstructure including movable functional elements. The microstructure is also designated as a MEMS structure (microelectromechanical system). During the operation of the sensors, a deflection of a functional element is detected, for instance, via a change in the electrical capacitance with respect to a fixed reference electrode.

A current method for manufacturing a micromechanical component includes forming the microstructure on a functional substrate and joining the functional substrate to a cap substrate, through which a hollow space (cavity or cavern) surrounding the functional elements of the microstructure is formed. A metallic or eutectic wafer bonding process may be carried out to join the two substrates. For such a joining technique, frame-shaped connecting structures, also known as a "bonding frame" or "bonding layer," which have metallic materials or materials matched to one another for the formation of a eutectic alloy, may be formed on the upper surfaces of the two substrates. In the bonding process, the individual connecting structures are joined to form a common connecting structure, thereby forming a hermetically tight seal situated around the microstructure.

In the case of the functional substrate, the connecting structure is produced prior to forming the microstructure. However, the "topography" associated with the connecting structure or "material plane" projecting from the upper surface of the functional substrate has an adverse influence on the production of the microstructure, during which a photolithographic patterning method is used. A result of the presence of the connecting structure situated about the subsequent microstructure is that in this region, the photoresist used in the patterning method cannot be deposited or spun on uniformly, and therefore makes waves or is subject to variations in thickness. In a subsequent exposure step, the uneven photoresist may cause unwanted scattering effects, through which (lateral) dimensions of the structures to be produced are subject to fluctuations. Such variations in structure width have a directly negative effect on the microstructure and, consequently, on the electrical properties of the sensor. The steady reduction in structural dimensions and the decrease in reserves or the distance between the connecting structure and microstructure increasingly amplifies this negative effect.

SUMMARY OF THE INVENTION

An object of the exemplary embodiments and/or exemplary methods of the present invention is to specify an improved design approach for manufacturing a micromechanical component.

This object is attained by a method according to the description herein and by a micromechanical component according to the description herein. Further advantageous embodiments of the present invention are provided in the further descriptions herein.

A method for manufacturing a micromechanical component is provided in accordance with the present invention. The method includes providing a first substrate, forming a first connecting structure on the first substrate, and forming a microstructure on the first substrate after forming the first connecting structure. The microstructure has at least one movable functional element. The method further includes providing a second substrate having a second connecting structure, and joining the first and second substrates by carrying out a bonding process; the first and second connecting structures being joined to form a common connecting structure, and a sealed cavity being formed in the region of the microstructure. The method distinguishes itself in that the first connecting structure takes the form of a buried connecting structure extending up to an upper surface of the first substrate.

The burying or recessing of the first connecting structure allows the option of producing a flat upper surface of the first substrate. In this manner, subsequent processes, in particular, the forming of the microstructure, are no longer subject to the interference or adverse influence of a projecting structure. Consequently, the microstructure may be produced with the desired dimensions in a reliable manner, and with a high precision. A further advantage is that a "meshing" of the common connecting structure results from the buried embodiment of the first connecting structure, which means that the joined configuration of the first and second substrates has a high mechanical rigidity. In particular, a rigidity with respect to lateral shear forces may be attained.

In an exemplary embodiment, the first substrate may be provided with a planar upper surface. The forming of the first connecting structure includes forming, on the first substrate, a trench structure extending from the upper surface, depositing a layer of a bonding material for the first connecting structure on the upper surface of the first substrate while filling up the trench structure, and removing the material outside of the trench structure.

The step of removing the bonding material may be implemented, for example, using a polishing process. By this means, the bonding material outside of the trench structure may be reliably removed.

In an alternative embodiment, after depositing the layer of bonding material, an additional filling material is introduced into a recess of the layer of the bonding material. The removal of the bonding material outside of the trench structure is carried out, using an etching process in which the bonding material and the additional filling material exhibit essentially the same etching rate. This procedure is associated with relatively low costs.

In a further exemplary embodiment, the first substrate is provided with a rough upper surface. The forming of the first connecting structure includes forming, on the first substrate, a trench structure extending from the rough upper surface, the trench structure having a rough base region; depositing a bonding material on the upper surface of the first substrate, the bonding material being introduced into the trench structure; and carrying out a polishing process, the bonding material outside of the trench structure being removed, and the first substrate being planarized. Since the polishing is used for both removing the bonding material outside of the trench structure and leveling the substrate, this embodiment may be implemented with a relatively low degree of complexity and relatively low costs.

In a further exemplary embodiment, the first substrate may be provided with a functional layer. The first connecting structure and the microstructure are formed in the functional layer.

In a further exemplary embodiment, the first connecting structure is formed so as to have a depth dimension in the micrometer range. Such a depth dimension may allow a good connection rigidity of the component to be attained.

With regard to the bonding process, there is the option of carrying out a eutectic bonding process or a thermocompression bonding process. Depending on the specific bonding process, the connecting structures have the same metallic material on each of the first and second substrates or, for forming a eutectic alloy, materials matched to one another.

A micromechanical component is also proposed in accordance with the present invention. The micromechanical component has a first substrate, which includes a microstructure having at least one movable functional element. Further provided is a second substrate, which is joined to the first substrate in such a manner that the microstructure is surrounded by a sealed cavity. In this connection, the first and second substrates are joined by a connecting structure formed within the scope of a bonding process. The micromechanical component distinguishes itself in that the first substrate has a trench structure, which is filled in by the connecting structure.

Such an embodiment promotes the manufacture of the micromechanical component, whose microstructure may be produced in a reliable manner, with a high precision. In addition, a high mechanical rigidity and robustness of the micromechanical component may be obtained via the connecting structure situated in the trench structure.

In the following, the exemplary embodiments and/or exemplary methods of the present invention are explained in greater detail in light of the figures.

DETAILED DESCRIPTION

With the aid of the following figures, methods for manufacturing a micromechanical component are described in which two substrates are joined to one another within the scope of a wafer bonding process. Processes and materials customary in semiconductor and microsystems technology may be used in the manufacturing methods, which means that these will only be discussed in part. Moreover, it is emphasized that further processes may be carried out in addition to the method steps shown and described.

Figure 1:
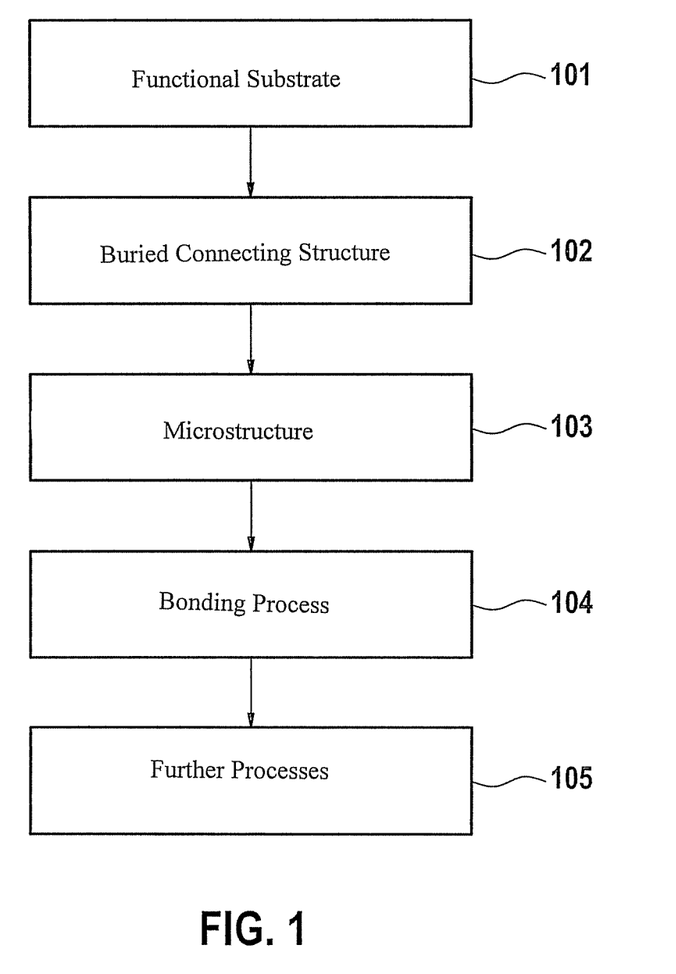
FIG. 1 shows a flow chart of a method for manufacturing a micromechanical component.

FIG. 1 shows a flow chart of a method for manufacturing a micromechanical component, which may be, e.g., an inertial sensor. In the method, a first substrate, which has a functional layer on one side, and which is referred to hereinafter as a functional substrate, is prepared in a step 101. In a subsequent step 102, a buried, frame-shaped connecting structure, also referred to as a "bonding layer" or "bonding frame," which extends to an upper surface of the substrate (or of the functional layer), is formed on the functional substrate or in its functional layer. Within the scope of steps 101 and 102, it is further provided that the upper surface of the substrate be planar. Apart from the buried embodiment of the connecting structure, this may be accomplished, for example, by planarizing the functional substrate in step 101 or in step 102.

Subsequent to this, in a step 103, a microstructure having at least one movable functional element is formed on the functional substrate or in its functional layer, in which case, inter alia, a photolithographic patterning method is used. Because of the flat upper surface of the substrate and the buried or recessed connecting structure, the photolithographic patterning method may be implemented at a high precision, which means that the microstructure may be produced with the desired dimensions at a high reliability and accuracy.

A bonding process is carried out in a further step 104, the functional substrate being joined to a second substrate, which is referred to below as a cap substrate. The cap substrate has a further, frame-shaped connecting structure or "bonding layer," which is adapted to the lateral dimensions of the buried connecting structure of the functional substrate, but, in contrast to the buried connecting structure, projects from an upper surface of the cap substrate. In the bonding process, the two frame-shaped connecting structures are pressed together and joined under the influence of temperature to form a common connecting structure, so that a seal situated around the microstructure is formed. In this manner, the microstructure is situated in an enclosed cavity and hermetically sealed from the environment.

Subsequent to this, further processes may be carried out which are combined in a further step 105 in the flowchart of FIG. 1. This may include, for example, the execution of a sectioning operation for preparing a separated micromechanical component, and the mounting of the component in a housing and/or producing of an electrical connection with one or more further components.

Further refinements of the method of FIG. 1, in light of which further details become apparent, are described in further detail with the aid of the following figures.

FIGS. 2 to 8 show, in each instance, a schematic lateral sectional view of the manufacture of a micromechanical component 190 by joining a functional substrate 110 to a cap substrate 170. Micromechanical component 190 may be, for example, an acceleration sensor that may be installed in a motor vehicle.

Figure 2:
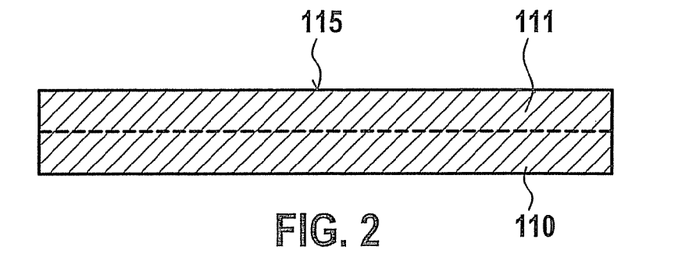
FIG. 2 shows a schematic lateral sectional view of the manufacture of a micromechanical component by joining a functional substrate to a second substrate.

FIG. 2 shows a representation of prepared functional substrate 110 after execution of a number of method steps. Functional substrate 110 has a functional layer 111 on one side, as is (simply) indicated by the dashed line in FIG. 2. In addition, functional substrate 110 (or its functional layer 111) has a planar upper surface 115. The functional substrate 110 shown in FIG. 2 may be formed, for example, in the manner described below.

Initially provided is a starting substrate 110, which may be, for example, a common wafer made of silicon. Several layers, including the functional layer 111 indicated in FIG. 2, are deposited on substrate 110. Further layers situated underneath functional layer 111 include, for example, an insulating layer and a sacrificial layer (not shown). Furthermore, it is conceivable for one or more enclosed conducting-path planes (not shown) to be provided in the insulating layer. Such conducting-path structures may be used for contacting micromechanical component 190 or a microstructure 140 of component 190.

Functional layer 111 may be a so-called epi-polysilicon layer, that is, a polycrystalline silicon layer produced in an epitaxy process. Since a layer 111 grown in such a manner normally has a rough upper surface (see FIG. 10 for comparison), a planarization process is also carried out after the deposition of such a functional layer 111, in order to provide functional substrate 110 of FIG. 2 with planar upper surface 115. In particular, a CMP process (chemical-mechanical polishing) is considered.

Figure 3:
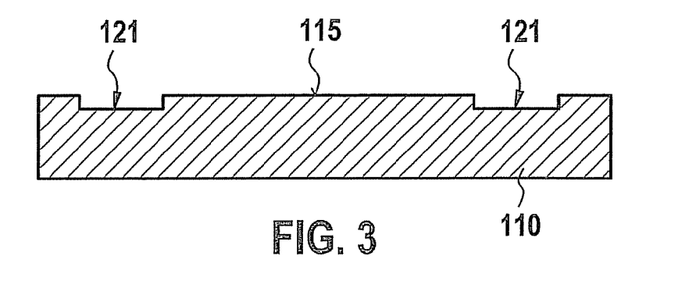
FIG. 3 shows another schematic lateral sectional view of the manufacture of a micromechanical component by joining a functional substrate to a second substrate.

Subsequently, as shown in FIG. 3, a trench structure 121 ("inverse bonding frame") extending from upper surface 115 is formed on functional substrate 110 (or in its functional layer 111). Trench structure 121 has (in the plan view) a closed shape surrounding a region of functional substrate 110, e.g., in the form of a rectangle or in the form of an annular shape (not shown). In a later method step, a microstructure 140 is also formed in the enclosed region.

As shown in FIG. 3, a cross-section of trench structure 121 has an essentially rectangular contour. The depth of trench structure 121 is, for example, in the micrometer range, e.g., in a range of one to four micrometers. Both the trench depth and the trench width of trench structure 121 may be selected or stipulated as a function of an amount of a bonding material 130, which is introduced into trench structure 121, and by which the bond to cap substrate 170 is produced.

A photolithographic patterning and etching method may be executed for forming trench structure 121. In this connection, a layer of a photoresist is initially deposited onto upper surface 115 of functional substrate 110 (or of functional layer 111), and the photoresist is patterned (by selective exposure and development), through which upper surface 115 is partially exposed and the (lateral) structure of trench structure 121 (and consequently, of the later bonding frame) is defined. A trench etching process, in which the patterned photoresist functions as an etching mask, is subsequently carried out. For example, a plasma etching process is a process considered for trench or silicon etching. Subsequent to this, the photoresist is removed again.

Figure 4:
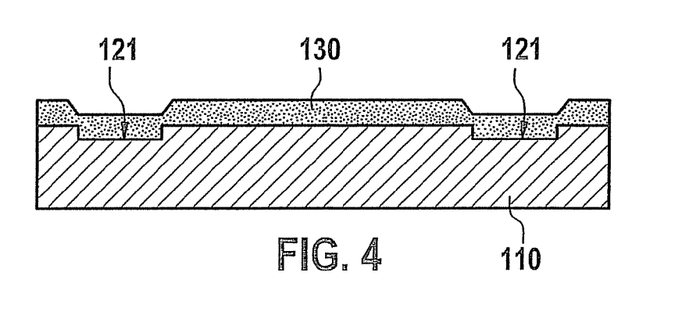
FIG. 4 shows another schematic lateral sectional view of the manufacture of a micromechanical component by joining a functional substrate to a second substrate.

After forming trench structure 121, a layer of a bonding material 130 is deposited on an entire or a large area of upper surface 115 of functional substrate 110, as shown in FIG. 4; trench structure 121 being completely filled up by bonding material 130. For example, bonding materials 130 considered include aluminum or copper. A coating method, i.e., depending on the material, e.g., a physical gas-phase deposition (PVD, physical vapor deposition) or a chemical gas-phase deposition (CVD, chemical vapor deposition), may be executed to apply bonding material 130.

Figure 5:
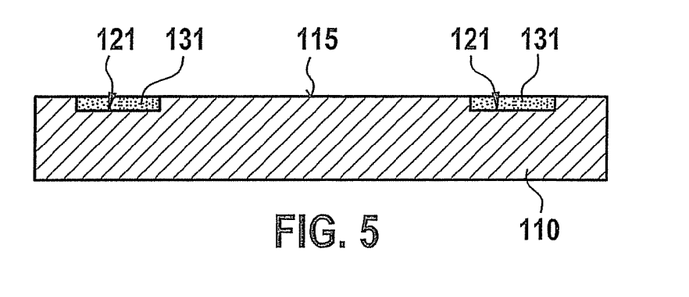
FIG. 5 shows another schematic lateral sectional view of the manufacture of a micromechanical component by joining a functional substrate to a second substrate.

In a subsequent step, the bonding material 130 outside of trench structure 121 is removed, so that as shown in FIG. 5, bonding material 130 remains only inside of trench structure 121 and fills in trench structure 121 (completely) up to upper surface 115, and a buried, frame-shaped connecting structure 131 ("bonding layer") is formed. For this purpose, a polishing process such as a CMP process may be implemented, in which bonding material 130 may be removed selectively with regard to silicon (that is, the material of functional substrate 110 or its functional layer 111).

Figure 6:
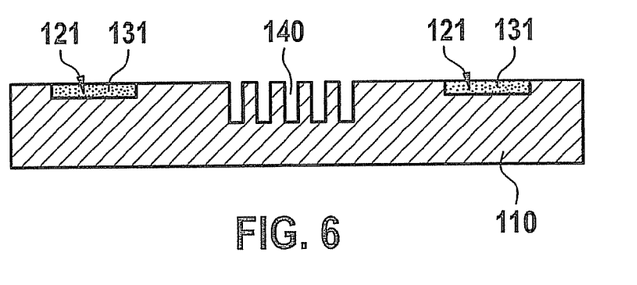
FIG. 6 shows another schematic lateral sectional view of the manufacture of a micromechanical component by joining a functional substrate to a second substrate.

The recessed embodiment of connecting structure 131 allows upper surface 115 of functional substrate 110 to be planar (again), which means that subsequent processes are not subject to any influence of an exposed structure. This applies, in particular, to the subsequent forming of microstructure 140 (also referred to as "sensor core"), which is represented in FIG. 6 and has movable functional elements in the region of functional substrate 110 surrounded by buried connecting structure 131; the forming of the microstructure being able to be accomplished in the manner described below.

A photolithographic patterning and etching method is initially executed, in order to form trenches via which the functional elements of microstructure 140 are pre-patterned. For this purpose, a layer of a photoresist (not shown) is deposited on a large area of upper surface 115 of functional substrate 110 (or of functional layer 111). The photoresist layer is then patterned (by selective exposure and development), through which upper surface 115 is partially exposed and the (lateral) structure of the functional elements is defined. This is followed by the etching of trenches, e.g., by executing a plasma etching method, the patterned photoresist layer being used as an etching mask. The trenches produced in this manner extend to the above-mentioned sacrificial layer underneath functional layer 111. Subsequent to this, the functional elements of microstructure 140 pre-patterned via the trench etching are exposed. For this purpose, an etching agent or etching gas such as hydrofluoric acid vapor is introduced through the trenches to the sacrificial layer, whereby a part of the sacrificial layer is removed. This exposes the functional elements and consequently renders them movable.

Planar upper surface 115 of functional substrate 110 promotes, in particular, the photolithographic patterning method executed in the production of microstructure 140, since the photoresist used may be deposited on or spun onto upper surface 115 in the form of a relatively flat layer. In this manner, unwanted scattering effects, by which the structural fidelity may be affected, may be substantially suppressed or prevented in the subsequent exposure step. Accordingly, microstructure 140 may be produced with the desired dimensions in a highly reliable and accurate manner.

Figure 7:
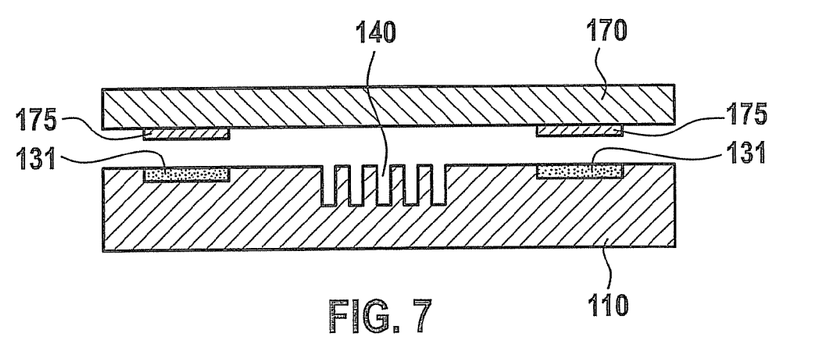
FIG. 7 shows another schematic lateral sectional view of the manufacture of a micromechanical component by joining a functional substrate to a second substrate.
Figure 8:
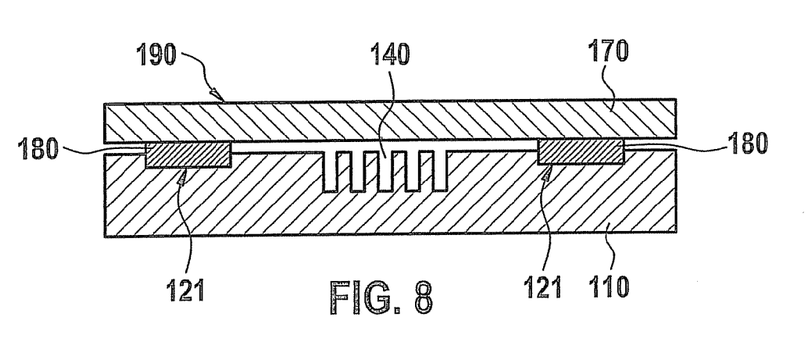
FIG. 8 shows another schematic lateral sectional view of the manufacture of a micromechanical component by joining a functional substrate to a second substrate.

Subsequent to this, functional substrate 110 and cap substrate 170, which has a projecting, frame-shaped connecting structure 175 at a surface, are brought together as shown in FIG. 7 and are joined to one another by executing a wafer bonding process, via which component 190 shown in FIG. 8 is formed.

Cap substrate 170 may be, for example, a further silicon wafer, on which connecting structure 175 is produced by depositing a corresponding coating on a large area and patterning the same. Materials, which are considered for connecting structure 175 and are matched to material 130 of connecting structure 131 of functional substrate 110, may include, for example, aluminum, copper or germanium. With regard to the shape and the lateral dimensions, connecting structure 175 may essentially correspond to connecting structure 131 of functional substrate 110. It is also possible to design connecting structure 175 to be somewhat narrower (that is, to have a lower structural width), in order to allow a reliable bond in the course of the bonding process, even in the case of misalignment of substrates 110, 170.

In the bonding process, connecting structures 131, 175 of the two substrates 110, 170 are pressed together under the influence of temperature and form, as shown in FIG. 8, a common connecting structure 180 situated around microstructure 140. By this means, microstructure 140 is situated in an enclosed cavity and, in this manner, hermetically sealed with respect to the environment. The joining of the two substrates 110, 170 may be accomplished in a defined atmosphere having a predetermined (e.g., very low) pressure, in order to set a defined pressure in the cavity between the two substrates 110, 170.

With regard to the bonding process, either a eutectic bonding process or a thermocompression bonding process is carried out, which depends on the materials of connecting structures 131, 175 of the two substrates 110, 175. In a eutectic bonding process in which a eutectic alloy or a eutectic is formed from different materials, connecting structures 130, 175 have corresponding materials matched to one another, for instance, aluminum and germanium. In this respect, the connecting structure 180 joining the two substrates 110, 170 of component 190 may have an aluminum-germanium alloy. In a thermocompression bonding process, connecting structures 131, 175 each have the same metallic material, thus, e.g., aluminum or copper, which means that common connecting structure 180 may have aluminum or copper, as well.

In the case of component 190, common connecting structure 180 is also situated in trench structure 121 of functional substrate 110, i.e., trench structure 121 is filled up by connecting structure 180 or a part of connecting structure 180. In this manner, connecting structure 182 is "meshed" with functional substrate 110, which means that component 190 has a high mechanical rigidity. In particular, a high rigidity with respect to lateral shear forces may be attained.

Subsequent to the above-described method steps and processes, further processes may be carried out in order to complete the manufacture of component 190. A possible process is, for example, a sectioning process for separating component 190 (from other components).

With regard to the method represented in FIGS. 2 through 8, bonding material 130 outside of trench structure 121 may also be removed without the polishing process described with the aid of FIGS. 4 and 5. A possible process is "lacquer planarization," which is described below in further detail in view of FIG. 9.

Figure 9:
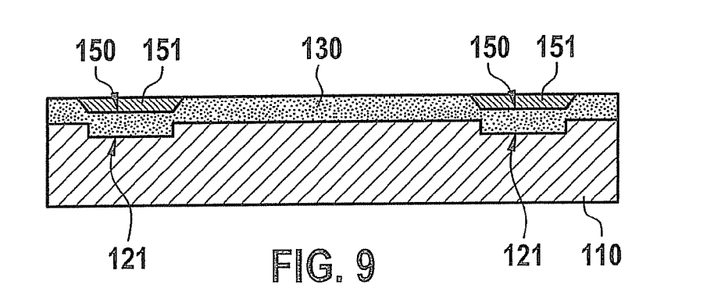
FIG. 9 shows a schematic lateral sectional view of a functional substrate for clarification of a modification of a manufacturing method.

FIG. 9 shows a representation of functional substrate 110, which corresponds to FIG. 4 and has the layer of bonding material 130 deposited on a large area. Due to trench structure 121, the deposited layer of bonding material 130 has a recess 150 in the region of trench structure 121. A filling material 151 is introduced into this recess 150. This may be, in particular, a polymer material or a photoresist 151, which may smooth out the topography of the layer of bonding material 130 by spin-on deposition and is therefore situated only inside of recess 150, as shown in FIG. 9.

In this embodiment, to remove the bonding material 130 outside of trench structure 121 and to form buried connecting structure 131 (see FIG. 5 for comparison), an etching or back-etching process is conducted, in which bonding material 130 and filling material 150 are etched at essentially the same etching rate and, therefore, a uniform removal of the two materials 130, 151 takes place. This process may be conducted at a lower cost than polishing.

FIGS. 10 through 16 show a further method for manufacturing a micromechanical component 191 by joining a functional substrate 110 to a cap substrate 170, the further method being similar or comparable to the method described with the aid of FIGS. 2 through 8. Therefore, in view of details already described that relate to applicable method steps, possible materials, mentioned advantages, etc., reference is made to the embodiments above.

Figure 10:
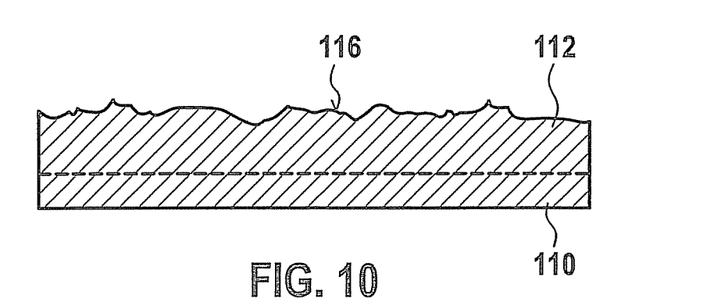
FIG. 10 shows a schematic lateral sectional view of the manufacture of a further micromechanical component by joining a functional substrate to a second substrate.

In this method, as shown in FIG. 10, a functional substrate 110 having a functional layer 112 on one side is provided (only indicated in FIG. 10). Functional layer 112 may be, once more, an epi-polysilicon layer, which (in addition to other layers) is formed on a starting substrate or a wafer made of silicon. In contrast to FIG. 2, the functional layer 112 in the prepared functional substrate 110 of FIG. 10 is not (yet) subjected to any planarization. Therefore, functional substrate 110 or its functional layer 112 has a rough upper surface 116.

Figure 11:
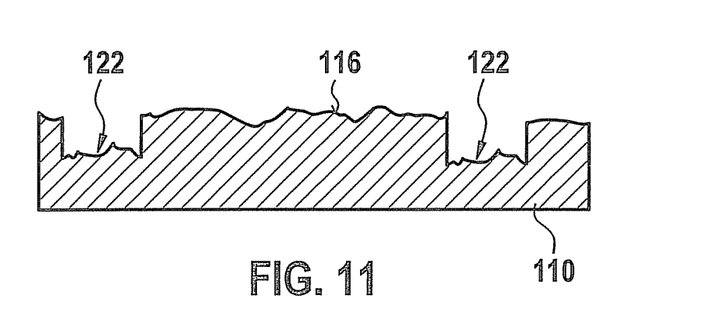
FIG. 11 shows another schematic lateral sectional view of the manufacture of a further micromechanical component by joining a functional substrate to a second substrate.

Subsequently, as shown in FIG. 11, a trench structure 122 ("inverse bonding frame") extending from rough upper surface 116 is formed on functional substrate 110 (or in its functional layer 112), which may be accomplished within the scope of a photolithographic patterning and etching method. In this connection, rough upper surface 116 is also carried over into trench structure 122, so that in contrast to trench structure 121, trench structure 122 has a rough bottom region (see FIG. 3 for comparison). In addition, trench structure 122 may be formed with a somewhat greater etching or trench depth than trench structure 121, which is selected in view of a later polishing step (including a removal of, for example, one to four micrometers, depending on the layer thickness of the grown epi-polysilicon). Trench structure 122 has (in the plan view) a shape that surrounds a region of functional substrate 110.

Figure 12:
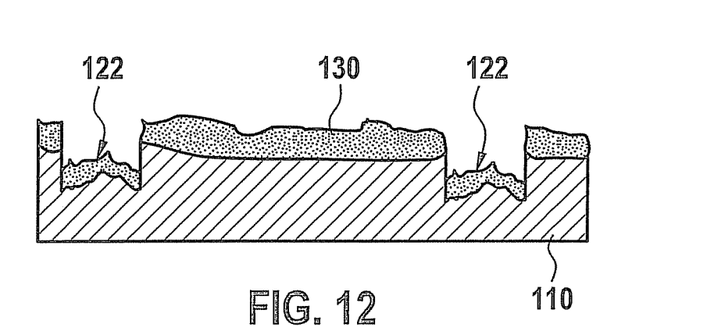
FIG. 12 shows another schematic lateral sectional view of the manufacture of a further micromechanical component by joining a functional substrate to a second substrate.

Subsequent to this, a bonding material 130 is deposited on a large area of upper surface 116 of functional substrate 110, as shown in FIG. 12, bonding material 130 also being introduced into trench structure 122. In this connection, trench structure 122 may only be partially filled up with the bonding material, so that (in contrast to FIG. 4,) bonding material 130 does not form a continuous layer.

Subsequently, a polishing process, in particular, a CMP process, is conducted in which both bonding material 130 outside of trench structure 122 is removed and functional substrate 110 is planarized. In this manner, functional substrate 110 is formed to have the shape shown in FIG. 13. In this connection, functional substrate 110 has a planar upper surface 115 and a buried connecting structure 132, which is formed by the bonding material 130 filling up trench structure 122 (completely) to upper surface 115.

Figure 14:
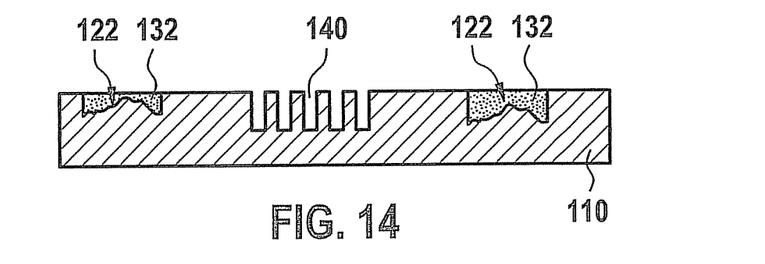
FIG. 14 shows another schematic lateral sectional view of the manufacture of a further micromechanical component by joining a functional substrate to a second substrate.

Subsequently, as shown in FIG. 14, a microstructure 140 having movable functional elements is formed on functional substrate 110 in the region surrounded by connecting structure 132. For this purpose, a photolithographic patterning and etching method may be carried out in order to form trenches for pre-patterning the functional elements, and subsequently, an etching agent may be directed into the trenches in order to expose the functional elements. Once again, planar upper surface 115 of functional substrate 110 proves to be advantageous with regard to the photolithographic patterning method, since the photoresist used may be deposited or spun on upper surface 115 as a planar layer. Consequently, microstructure 140 may be formed with a high precision.

Figure 15:
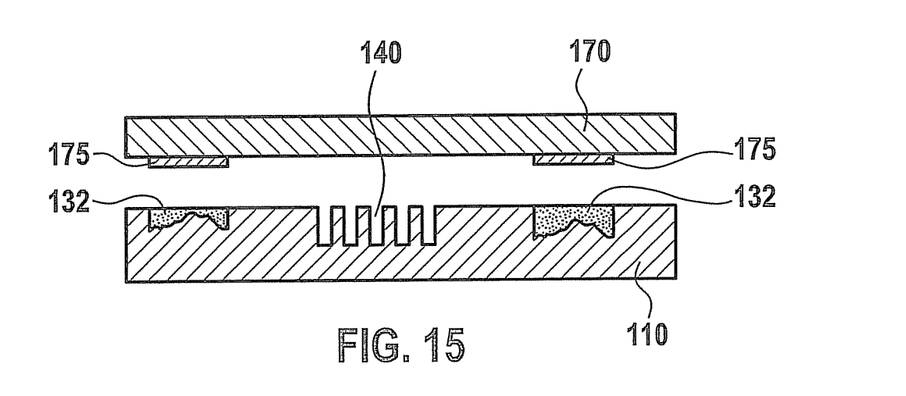
FIG. 15 shows another schematic lateral sectional view of the manufacture of a further micromechanical component by joining a functional substrate to a second substrate.
Figure 16:
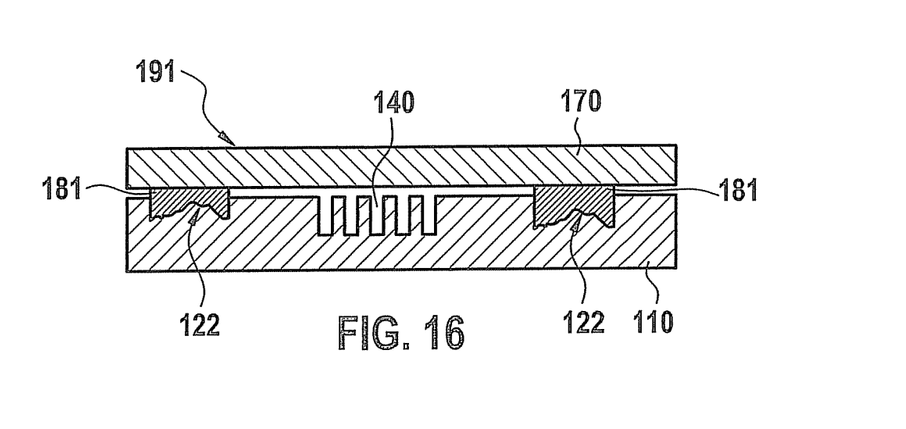
FIG. 16 shows another schematic lateral sectional view of the manufacture of a further micromechanical component by joining a functional substrate to a second substrate.

Subsequent to this, functional substrate 110 and cap substrate 170, which has a projecting, frame-shaped connecting structure 175 on a surface, are brought together as represented in FIG. 15, and are joined to one another by implementing a wafer bonding process (i.e., a eutectic bonding process or a thermocompression bonding process), in order to form component 191 shown in FIG. 16. In the bonding process, connecting structures 132, 175 of the two substrates 110, 170 are pressed together under the influence of temperature and form a common connecting structure 181 situated around microstructure 140, which means that microstructure 140 is situated in an enclosed cavity and hermetically sealed with respect to the environment.

Figure 13:
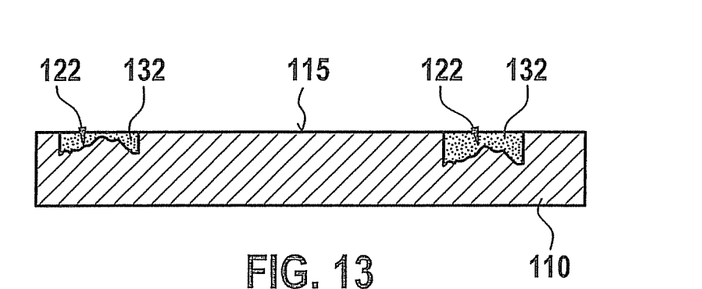
FIG. 13 shows another schematic lateral sectional view of the manufacture of a further micromechanical component by joining a functional substrate to a second substrate.

In the method represented in FIGS. 10 through 16, the polishing step described with the aid of FIGS. 12 and 13 is used for both removing bonding material 130 outside of trench structure 122 and planarizing functional substrate 110. In this manner, this method may be implemented with a relatively low degree of complexity and relatively low costs. In addition, the roughened base region of trench structure 122 may produce additional meshing or improved fixation and, consequently, an increased mechanical strength of common connecting structure 181.

The specific embodiments explained in light of the figures represent exemplary embodiments of the present invention.

Instead of the specific embodiments described, additional specific embodiments are conceivable, which may include further modifications or combinations of described features.

With regard to materials mentioned, there is the possibility, for example, of replacing these with other materials. In addition, other substrates having a different construction or different structures may be provided and/or other substrates having a semiconductor material different from silicon may be used, in order to produce a micromechanical component having the above-described attachments. Furthermore, processes other than those described may be carried out and/or further elements and structures may be formed.

For example, there is the possibility of providing cap substrate 170 with an additional recess or cavity inside connecting structure 175; after the joining of the cap substrate to the functional substrate, the recess or cavity forming a part of the cavity for microstructure 140. Cap substrate 170 may also have additional electrical or electronic structures. In this respect, cap substrate 170 may be, for example, an ASIC wafer (application specific integrated circuit).

In addition, the shown connecting structure 175 of cap substrate 170 may simply be formed in the shape of a projecting structure, which is formed by removing or etching substrate material of cap substrate 170 (outside of connecting structure 175). In the case of a silicon cap substrate 170, in which connecting structure 175 also includes silicon in such an embodiment, gold may be considered, for example, as a bonding material 130 of functional substrate 110. In this manner, substrates 110, 170 may be joined using a eutectic bonding process; common connecting structure 180, 181 formed in the bonding process including a silicon-gold alloy.

In addition, it shall be pointed out that (in the plan view,) the connecting structures 131, 132, 175 described may not have just the shape of a closed frame. Also possible is an embodiment, in which only a partial region is frame-shaped in order to surround a microstructure 140. At least one further (e.g., bar-shaped) partial region may extend from the frame-shaped partial region or border on it.

Furthermore, the method is not limited to the manufacture of inertial sensors, but may also be used in a corresponding manner for manufacturing pressure sensors. In such a case, the microstructure formed on the functional substrate may have a deformable diaphragm having, e.g., piezoresistive elements, and an absolute- or reference-pressure chamber of the pressure sensor in question may be produced by joining the functional substrate to the cap substrate.

In addition, it is pointed out that the method is not limited to the manufacture of a single microstructure surrounded by a bonding frame. Using the method, a plurality of components, each having one or more enclosed microstructures, may be produced essentially simultaneously or in parallel by joining a functional substrate to a cap substrate, in which case corresponding, frame-shaped connecting structures or connecting structures having contiguous, frame-shaped partial regions are used.

What is claimed is:

1. A method for producing a micromechanical component, the method comprising:
    providing a first substrate;
    forming a first connecting structure on the first substrate;
    forming a microstructure on the first substrate after forming the first connecting structure, the microstructure having at least one movable functional element;
    providing a second substrate having a second connecting structure; and
    joining the first substrate and the second substrate by carrying out a bonding process, the first connecting structure and the second connecting structure being joined to form a common connecting structure, wherein a sealed cavity is formed in the region of the microstructure;
    wherein the first connecting structure is formed as a buried connecting structure extending to an upper surface of the first substrate.

2. The method of claim 1, wherein the first substrate is provided with a planar upper surface, and wherein the forming of the first connecting structure includes:
    forming, on the first substrate, a trench structure extending from the upper surface;
    depositing a layer of a bonding material for the first connecting structure on the upper surface of the first substrate while filling up the trench structure; and
    removing the bonding material outside of the trench structure.

3. The method of claim 2, wherein the bonding material outside of the trench structure is removed by a polishing process.

4. A method for producing a micromechanical component, the method comprising:
    providing a first substrate;
    forming a first connecting structure on the first substrate;
    forming a microstructure on the first substrate after forming the first connecting structure, the microstructure having at least one movable functional element;

providing a second substrate having a second connecting structure; and joining the first substrate and the second substrate by carrying out a bonding process, the first connecting structure and the second connecting structure being joined to form a common connecting structure, wherein a sealed cavity is formed in the region of the microstructure;

wherein the first connecting structure is formed as a buried connecting structure extending to an upper surface of the first substrate; and wherein the first substrate is provided with a planar upper surface, and wherein the forming of the first connecting structure includes:

forming, on the first substrate, a trench structure extending from the upper surface;

depositing a layer of a bonding material for the first connecting structure on the upper surface of the first substrate while filling up the trench structure;

after depositing the layer of bonding material, introducing an additional filling material into a recess of the layer of the bonding material; and     removing the bonding material outside of the trench structure, using an etching process in which the bonding material and the additional filling material have essentially the same etching rate.

5. A method for producing a micromechanical component, the method comprising:

providing a first substrate;

forming a first connecting structure on the first substrate;

forming a microstructure on the first substrate after forming the first connecting structure, the microstructure having at least one movable functional element;

providing a second substrate having a second connecting structure; and joining the first substrate and the second substrate by carrying out a bonding process, the first connecting structure and the second connecting structure being joined to form a common connecting structure, wherein a sealed cavity is formed in the region of the microstructure;

wherein the first connecting structure is formed as a buried connecting structure extending to an upper surface of the first substrate;

wherein the first substrate is provided with a rough upper surface, and wherein the forming of the first connecting structure includes:

forming, on the first substrate, a trench structure extending from the rough upper surface, the trench structure having a rough base region;

depositing a bonding material on the upper surface of the first substrate, the bonding material being introduced into the trench structure; and     carrying out a polishing process, the bonding material outside of the trench structure being removed, and the first substrate being planarized.

6. The method of claim 5, wherein the first substrate is provided with a functional layer, and wherein the first connecting structure and the microstructure is formed in the functional layer.

7. The method of claim 5, wherein the second connecting structure in the provided second substrate projects from an upper surface of the second substrate.

8. The method of claim 5, wherein the first connecting structure is formed to have a depth dimension in the micrometer range.

9. The method of claim 5, wherein the bonding process includes one of a eutectic bonding process and a thermocompression bonding process.

* * * * *